United States Patent [19]

Mabuchi et al.

[11] Patent Number: 4,773,955

[45] Date of Patent: Sep. 27, 1988

[54] PRINTED WIRING BOARD FOR MOUNTING ELECTRONIC PARTS AND PROCESS FOR PRODUCING THE SAME

[75] Inventors: Katsumi Mabuchi, Motosu; Toshimi Komura, Ogaki, both of Japan

[73] Assignee: Ibiden Co. Ltd., Ogaki, Japan

[21] Appl. No.: 54,122

[22] Filed: May 14, 1987

Related U.S. Application Data

[62] Division of Ser. No. 756,990, filed as PCT JP84/00565, Nov. 27, 1984, published as WO85/02515, Jun. 6, 1985, Pat. No. 4,737,395.

[30] Foreign Application Priority Data

Nov. 29, 1983 [JP] Japan .................. 58/225237

[51] Int. Cl.⁴ .............................................. B32B 31/00
[52] U.S. Cl. ..................................... 156/257; 427/96; 361/386; 361/401; 156/150; 156/250; 156/901; 156/902
[58] Field of Search ....................... 361/386, 388, 401; 156/901, 902, 150, 151, 153, 250, 251, 256, 257; 427/96

[56] References Cited

U.S. PATENT DOCUMENTS 4,410,927 10/1983 Butt ..................................... 361/386
4,573,103 2/1986 Nilsson .............................. 361/386

Primary Examiner—John E. Kittle
Assistant Examiner—P. J. Ryan
Attorney, Agent, or Firm—Balogh, Osann, Kramer, Dvorak, Genova & Traub

[57] ABSTRACT

A printed wiring board comprising a plastic material is formed with a through opening for mounting electronic parts therein, and the end of the opening on the rear side of the board is closed by a metal sheet bonded to the area around the opening end on the rear of the board through an adhesive layer. The inside wall and bottom face of the opening in the board are coated with an integral plating film as are the rear surfaces of the board an metal sheet. According to this board structure, the heat generated from electronic parts mounted on the bottom of the opening is dispersed by the metal sheet, and also penetration of moisture into the opening through the plastic material and the adhesive layer, as occurs with conventional boards, is prevented by the plating film.

4 Claims, 4 Drawing Sheets

PRINTED WIRING BOARD FOR MOUNTING ELECTRONIC PARTS AND PROCESS FOR PRODUCING THE SAME

This is a divisional of co-pending application Ser. No. 756,990 filed as PCT84/00565 on Nov. 27, 1984, published as WO85/02515 on June 6, 1985, now U.S. Pat. No. 4,737,395.

TECHNICAL FIELD

This invention relates to a printed wiring board used for mounting electronic parts such as various kinds of chips and semiconductor elements, and a process for producing such a printed wiring board.

Especially, the present invention is intended to provide a printed wiring board having excellent characteristics for dispersing heat generated from the mounted electronic parts and which also has substantially moisture-proof, and a process for producing such a printed wiring board.

BACKGROUND ART

Conventional printed wiring boards designed for directly mounting electronic parts are generally used as circuit boards for timepieces, cameras and such. Use of such boards has the merit of allowing a reduction of size and thickness of the articles manufactured by using such boards.

Plastics and/or ceramics are used as materials of which these printed wiring boards are made plastic being the most widely used. Generally, printed wiring boards made of plastic can be made to precise dimensions and is stronger in mechanical shock than those made of ceramic material such as alumina. However, the thermal conductivity of plastic is very low, about 1/60 of that of alumina ceramic, and for this reason, conventional plastic boards are still unsatisfactory for practical use as a board for mounting IC's with a large scale of integration or electronic parts requiring high power.

In order to overcome this problem, various proposals, such as mentioned below, have been made on the type of printed wiring boards in which a metal plate of high thermal conductivity is adapted to the plastic board and electronic parts are directly mounted on such metal plate for better heat dispersion.

This applicant has previously disclosed a printed wiring board for mounting semiconductors and IC chips in Japanese Utility Model Laid-Open No. 10060/79. In this disclosed printed wiring board, a recess of a specified depth is provided at the part of the board where semiconductors and IC chips are to be mounted, and in said recess is further provided a through-hole of a specific configuration, with the region around said through-hole being designed to constitute a supporting region on which a thin metal sheet is seated for carrying thereon semiconductors and IC chips. This printed wiring board, however, had the problems that in the manufacture of this board, if the horizontal sectional area of the recession is increased, the space allowed for circuit arrangement on the board surface is accordingly decreased; therefore, it is necessary to enlarge the planar area of the printed wiring board itself to accommodate high-density wiring, while if the horizontal sectional area of said recess is small, the area of the supporting region decreases correspondingly so as to adversely affect adhesion between the metal sheet and the supporting region. Further, extremely high accuracy is required for working the inner peripheral surface of the recession and metal sheet for tightly fitting the metal sheet to the inner peripheral surface of said recession. It increases the cost of working and reduces productivity. There was also the problem of the reduced working life of electronic parts, as the penetration of atmospheric moisture into electrical components mounted on the metal sheet in said recession could not be prevented.

Japanese Utility Model Laid-Open No. 172970/81 discloses a circuit board for timepieces incorporating a laminated reinforcing material such as metal or ceramic, in which the recession for mounting LSI is formed after said reinforcement has been laminated to the circuit board. This device, however, will not prevent penetration of moisture into the LSI mounted recession through the adhesive layer bonding the board and reinforcement, thereby resulting in a reduced life of LSI.

Japanese patent Laid-Open No. 166056/82 discloses an integrated module principally composed of a printed wiring board and logical units, that is, chips fixed thereon, in which a single-layer or multi-layer supporting base is provided with an opening into which a stepped region of a heat dissipator correctly joined to said supporting base extends, and on the side opposite from said supporting base, said logical units are directly secured on said stepped portion of the heat dissipator by a medium having high thermal conductivity. In this integrated module, however, since the stepped portion of the heat dissipator is joined to the opening of the printed wiring board, atmospheric moisture is liable to reach the logical units through said joint, so that said logical units tend to suffer early failure and are have a short service life.

The present invention has for its object to provide a printed wiring board for mounting electronic parts which is free of said disadvantages of the prior art, has excellent heat dispersion characteristics moisture resistance and high reliability and which is readily adaptable to high-density wiring, and a process for producing such printed wiring board.

DISCLOSURE OF THE INVENTION

The present invention discloses a printed wiring board for mounting electronic parts in which an opening piercing the board comprising a plastic material is formed in the region of the board where electronic parts are to be mounted, and a metal sheet is bonded through an adhesive layer to at least that area on the rear side of the board which surrounds the end of said opening on the rear side of the board so that said opening end is closed by said metal sheet, characterized in that the plastic material forming the inside wall of said opening in the board, the adhesive layer and the inside of said metal sheet closing said open end on the rear side of the board are coated with an integral plating film, and further, at least the area of the rear side of the board surrounding the area where said metal sheet is bonded, the outer peripheral face of said adhesive layer and the lateral side and underside surface of said metal sheet are also coated with an integral plating film, and a process for producing such printed wiring board. Said integral coating film formed by plating can prevent ambient moisture from entering through the plastic material and adhesive layer into the opening of the board where electronic parts are mounted.

BEST MODE FOR CARRYING OUT THE INVENTION

The present invention will be described in detail below with reference to the accompanying drawings.

Figure 1:
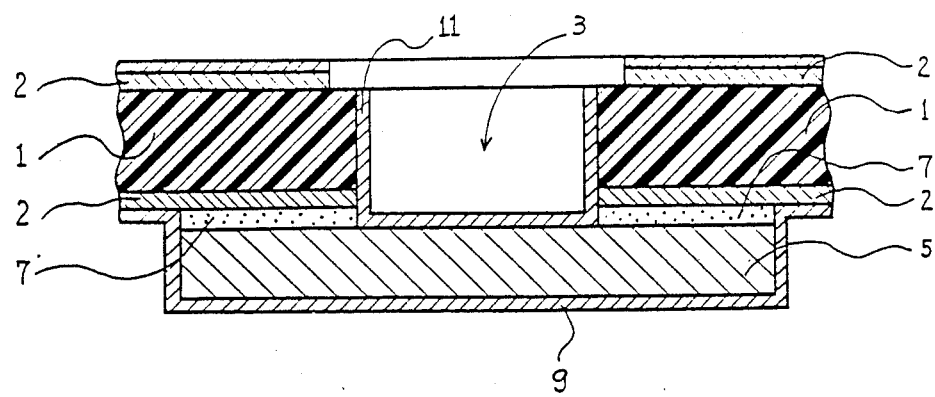
FIGS. 1 to 3 are vertical sectional views showing the structural setup in the embodiments of the printed wiring board for mounting electronic parts in accordance with the present invention.

Referring first to FIG. 1, there is shown a vertical sectional view of a printed wiring board comprising a plastic material according to this invention, the figure being intended to show an opening 3 formed therein for mounting electronic parts and the structural setup around said opening. Both upper and lower surfaces of base board 1 are covered with a metal foil 2. A metal sheet 5 is bonded through an adhesive layer 7 to the region surrounding the lower end of said opening 3 on the lower side, that is, rear side of said board 1. The underside of said metal sheet 5 and the area on the rear side of the base board outside the reach of said metal sheet 5 are coated with an integral film 9 formed by plating. A plated integral coating film 11 is also formed on the side wall of said opening 3 and its bottom region formed by said metal sheet 5.

A laminated plate of plastic material and glass cloth or paper is generally used as the wiring board, and a resin selected from epoxy resin, polyimide resin, triazine resin and phenolic resin or a mixture thereof is used as the plastic material. Such conventional boards containing plastic material are usable in this invention. However, said plastic material 1 and adhesive layer 7 have the property of absorbing moisture and allowing its permeating, so that with conventional boards having no integral coating film plated thereon ambient moisture cannot be prevented from entering the opening through said plastic material and adhesive layer, while heat generated by the operation of said electronic parts can be well dispersed through the metal sheet because the electronic parts are directly mounted on the metal sheet at the bottom of the opening.

As described above, in the wiring board according to this invention the adhesive layer 7 is sealed off from the ambient atmosphere by plating film 9 and the inside of the opening 3 is isolated from pastic material 1 and adhesive layer 7 by plating film 11, so that when electronic parts are mounted and functioning ambient moisture does not enter said opening 3.

Figure 2:
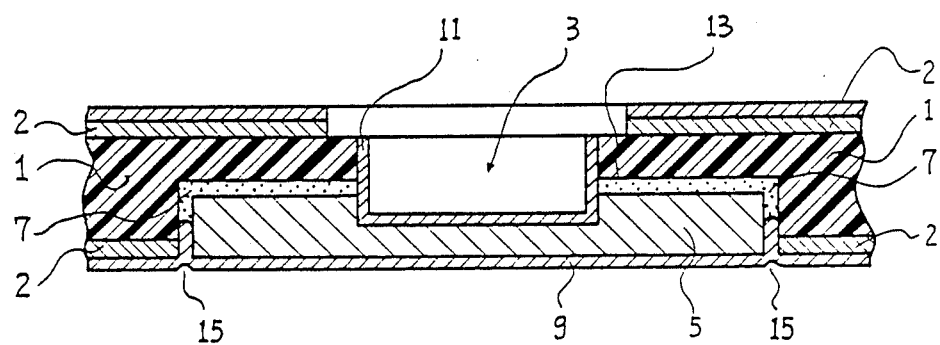
Figure 3:
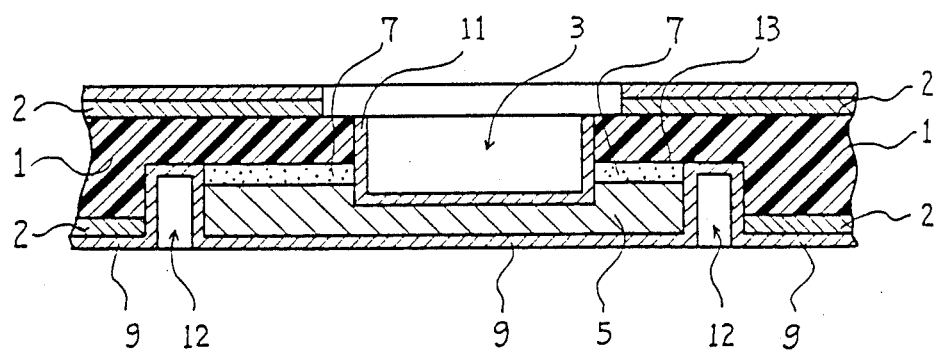
Figure 4A:
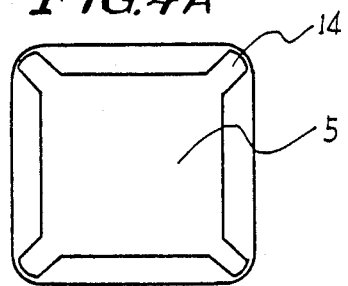
FIGS. 4 (a), (b), (c) and (d) are plane views showing the configurations of metal sheets specifically designed for secure positioning thereof in the printed wiring board of this invention and the configurations of the recession formed on the rear side of the board.
Figure 4B:
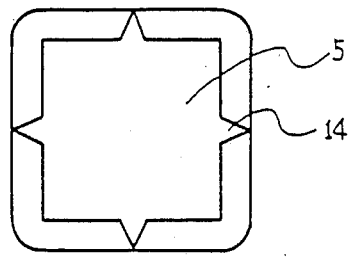
Figure 4C:
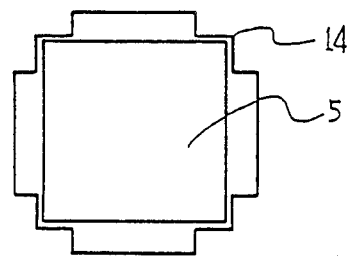
Figure 4D:
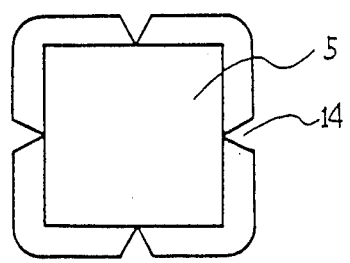
Figure 5A:
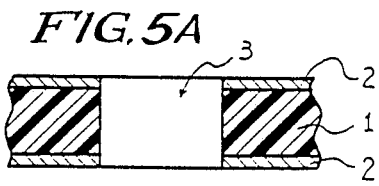
FIGS. 5 and 6 are vertical sectional views showing the sequential steps of the production process for said embodiments of the printed wiring board according to this invention.
Figure 6A:
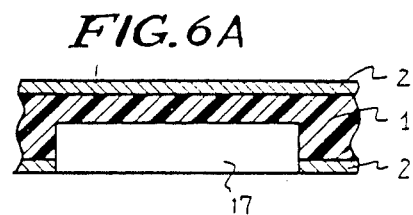
Figure 5B:
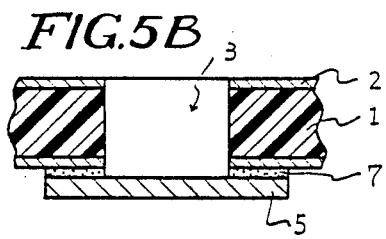
Figure 6B:
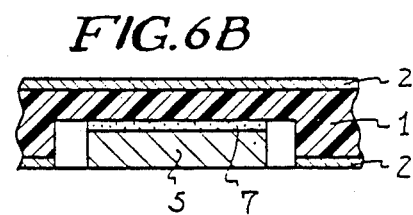
Figure 5C:
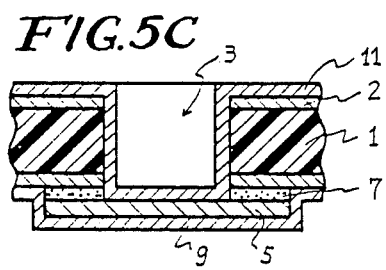
Figure 6C:
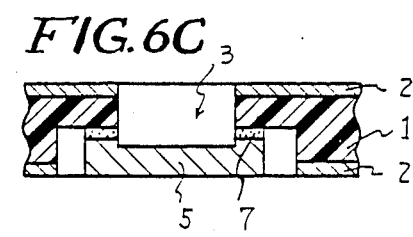
Figure 5D:
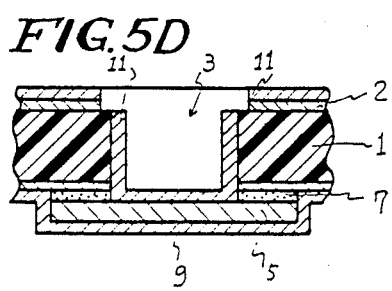
Figure 6D:
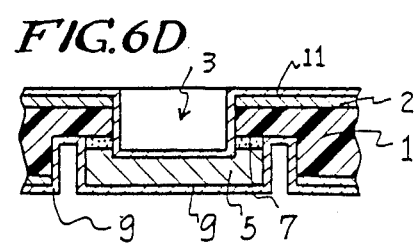
Figure 6E:
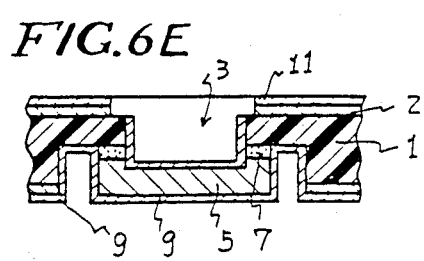

FIGS. 2 and 3 illustrate in vertical section the structure of other embodiments of a printed wiring board according to this invention. In these embodiments, unlike that of FIG. 1, the rear side of board 1 is recessed and a metal sheet 5 is bonded to the inside surface of the recess, that is, to be stepped region 13 formed by the recession, through an adhesive layer 7.

In the board illustrated in FIG. 2, the clearance between metal sheet 5 and side wall of the recess is smaller than that in the board shown in FIG. 3, so that the plating film 9 formed integrally on the rear side surfaces of said board 1 and metal sheet 5 is slightly indented, as shown by 15, at the part corresponding to the location of said clearance. In the board illustrated in FIG. 3, because the clearance between metal sheet 5 and side wall of the recession is large, there still remains a space 12 after the side wall of recession, the lateral and rear side faces of metal sheet 5 and the bottom portion of clearance have been plated to form an integral coating film 9. In these board embodiments formed with an indentation 15 shown in FIG. 2 or a space 12 shown in FIG. 3, the board of FIG. 3 has even better heat dispersion characteristics because of the greater area of the plating film on the rear side of board. Therefore, in the embodiments of the wiring board illustrated in FIGS. 2 and 3, in which integral plating films 9, 11 are provided as in the board of FIG. 1, ambient atmospheric moisture penetration into the opening 3 is completely prevented when electronic parts are mounted therein and operated, and also good heat dispersion characteristics are provided as in the conventional boards.

FIGS. 4 (a), (b), (c) and (d) are plane views showing various embodiments of metal sheet arrangement in the wiring boards of the structures shown in FIGS. 2 and 3. It will be seen that deformed regions or protuberances 14 are provided at the lateral side of metal sheet 5 and-/or the inner side of the recession for properly positioning the metal sheet in the recession for bonding it to the bottom of said recession provided on the rear side of the board and for preventing the metal sheet from being dislocated by vibration or impact force when electronic parts are mounted and are functioning. In the embodiments of FIGS. 4 (a) and (b), metal sheet 5 is provided with protuberances 14 at the four corners or at the four sides, whereby metal sheet 5 can be very easily and securely positioned and bonded to the bottom of the recession. In the embodiments of FIGS. 4 (c) and (d), deformed portions or protuberances 14 are provided at the inside wall of the recession, whereby the same effect as in the embodiments of (a) and (b) can be obtained.

The adhesive or bonding agent used for the board of this invention is selected from epoxy resin, polyimide resin, acrylic resin, triazine resin and modified resins thereof. These resins can be advantageously used for the purpose of this invention because of their excellent adhesiveness, heat resistance, durability and electrical insulating properties. For the metal sheet, metal materials having relatively high thermal conductivity such as copper, copper alloy, iron, iron alloy, aluminum and aluminum alloy can be advantageously used. Copper, nickel, gold, tin and the like can be used for plating.

Next, the process for producing the printed wiring board for mounting electronic parts according to this invention is described with reference to the accompanying drawings.

FIGS. 5 (a) to (d) illustrate in steps the process for producing a board according to this invention by showing the board structure in vertical section. As shown in (a), metal foil 2 is attached to both upper and lower surfaces of base board 1 and a through-opening 3 is formed in said base board 1 by punching or cutting.

Then metal sheet 5 is bonded to the area around the end of said opening on the metal foil 2 of the rear side of the board through the medium of adhesive layer 7 on the metal foil 2 as shown in (b). Next, as illustrated in (c), the inside wall of said opening 3, the lateral face of adhesive layer 7 exposed to said opening 3, the inside face of metal sheet 5 forming the bottom of said recession and the front side surface of base board 1 are plated to form an integral coating film 11. The same plating is also made on the rear surface of base board 1, the outer surface of metal sheet 5 and the externally exposed part of adhesive layer 7 to form an integral film 9. Thereby the objective board of the present invention can be obtained. FIG. 5 (d) illustrates an embodiment of a printed wiring board as obtained by other processes, such as stated below, on the board shown in (c). For instance, the surface of the board shown in (c) is coated with a photosensitive resin film and then a conductive circuit is formed, by conventional techniques, by etching after a desired circuit pattern of photo sensitive film is formed thereon. After such final processing, electronic parts such as semiconductor elements are mounted in the opening 3 and fixed in position with the aid of a silver paste or other means.

FIGS. 6 (a) to (e) show the sequential steps of the process for producing another embodiment of printed wiring board according to this invention. FIG. 6 (a) illustrates in vertical section the base board 1 applied with metal foil 2 on both upper and lower surfaces thereof and formed with a recess 17 on the rear side of the board by using an end mill. Then, in (b), metal sheet 5 is bonded to the bottom of said recess 17 through an adhesive layer 7. Then the front side of board 1 is machined by an end mill to form a further recession 3 to a depth which reaches at least said metal sheet 5 as shown in (c). Then, as illustrated in (d), an integral coating film 11 is formed by plating on the side wall of said further recession 3, the metal sheet face forming the bottom of said further recession 3 and the metal foil 2 on the board surface while also forming a similar film 9 on the rear side surface of the board, the side wall and bottom of clearance between board and metal sheet and the underside surface of metal sheet, thereby constituting a desired wiring board. FIG. 6 (e) shows an embodiment of the finished board structure as obtained by applying a photosensitive resin film on the surface of the board shown in (d), forming a desired circuit pattern thereon, etching the same and forming a conductor circuit by conventional techniques. After such finishing work has been completed, electronic parts such as semiconductor elements are mounted in the further recession 3 and fixed in position with a silver paste or other means.

Figure 7:
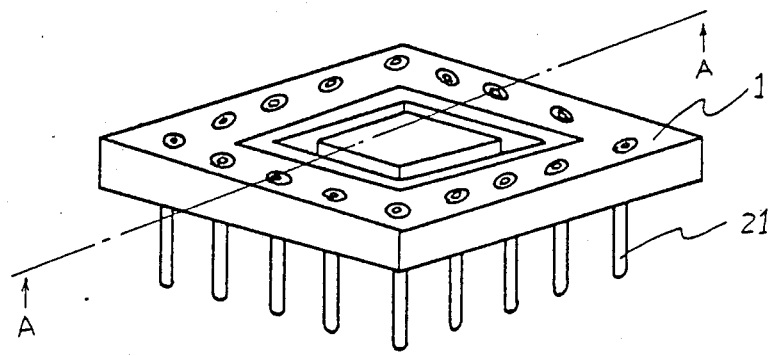
FIG. 7 is a perspective view of a pin grid array package manufactured by using the board for mounting electronic parts according to this invention as it was seen from the back of the board.
Figure 8:
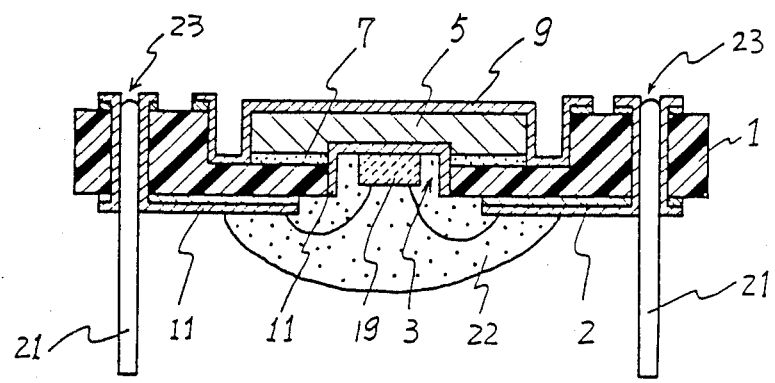
FIG. 8 is a longitudinal sectional view taken along the line A—A of FIG. 7.

FIG. 7 is a perspective view of a pin grid array package manufactured by using the board for mounting electronic parts according to this invention as it was seen from the rear side of the board, and FIG. 8 is a vertical sectional view taken along the line A—A of FIG. 7. In this package, LSI chip 19 is mounted in the further recession 3 of the printed wiring board 1 of this invention and the region around said LSI chip 19 is covered with epoxy resin 22. Conductor pins 21 for connection to other units extend from the side opposite metal sheet 5, said pins being secured in through-holes 23 which are electrically conductive with the circuit.

As described above, in the printed wiring board for mounting electronic parts according to this invention, electronic parts such as semiconductor elements are securely bonded to a metal sheet having high thermal conductivity, through a plating film, so that the heat generated from the mounted electronic parts is quickly and positively absorbed and dispersed. Further, since the inside of the further recession of the board as well as the rear side surfaces of board and metal sheet and in some cases the clearance between recession and metal sheet are coated with an integral plating film, it is possible to completely prevent penetration of ambient atmospheric moisture into the further recession through the plastic material and the adhesive layer. Moreover, on the board in which the metal sheet is adapted in a recess formed on the rear side of the board, said metal sheet can be so set that its underside does not bulge greatly from the rear plane of the board or is flush with said plane, so that a thinner board can be provided.

INDUSTRIAL APPLICABILITY

The board for mounting electronic parts according to this invention can be advantageously used as, for instance, an built-in printed wiring board for cameras, timepieces, etc., and a board for mounting semiconductor elements such as a chip carrier, a pin grid array package, a hybrid circuit board and the like.

What is claimed is:

1. A process for producing a printed wiring board for mounting electronic parts comprising a sequence of the following steps (a) to (d):
    (a) forming a through opening in a given region of a base board made from a plastic material, on which region electronic parts are to be mounted;
    (b) covering said opening with a metal sheet and bonding said metal sheet to the rear side of the base board with an adhesive layer;
    (c) plating the external surface of the base board including the metal sheet; and
    (d) forming a circuit by conventional techniques on the base board manufactured through said foregoing steps.

2. A process for producing a printed wiring board for mounting electronic parts comprising a sequence of the following steps:
    (a) forming a recession beneath a given region of a base board made from a plastic material, on which region electronic parts are to be mounted;
    (b) bonding a metal sheet within said recession with an adhesive layer;
    (c) forming a further recession in said given region on the front of said base board so that said further recession will reach at least said metal sheet;
    (d) plating the external surface of the base board including said metal sheet; and
    (e) forming a circuit by conventional techniques on the base board manufactured through said foregoing steps.

3. A process according to claim 2, including step (b) in which a metal sheet is bonded within said further recession by an adhesive layer in such a manner that a recessed groove having a predetermined clearance will be between the outer peripheral face of said metal sheet and the opposing inner peripheral face of said recession.

4. A process according to claim 3, including a step (b) in which a metal sheet is bonded by positioning it on the stepped portion in said recess so that the inner peripheral face of said recess and the opposing outer peripheral face of said metal sheet will contact each other at a number of sections and said recessed groove will maintain a predetermined clearance.

* * * * *